United States Patent
Chiu et al.

(10) Patent No.: US 6,680,256 B2
(45) Date of Patent: Jan. 20, 2004

(54) PROCESS FOR PLANARIZATION OF FLASH MEMORY CELL

(75) Inventors: Hung-Yu Chiu, Kaohsiung (TW); Chun-Lien Su, Tainan Hsien (TW); Wen-Pin Lu, Yilan (TW)

(73) Assignee: Macronix International, Co., Ltd. (TW)

( * ) Notice: Subject to any disclaimer, the term of this patent is extended or adjusted under 35 U.S.C. 154(b) by 192 days.

(21) Appl. No.: 09/881,438

(22) Filed: Jun. 14, 2001

(65) Prior Publication Data

US 2002/0168861 A1 Nov. 14, 2002

(30) Foreign Application Priority Data

May 10, 2001 (TW) ........................................ 90111196 A

(51) Int. Cl.[7] ............................................. H01L 21/302
(52) U.S. Cl. ..................... 438/706; 438/719; 438/723; 257/314; 257/316
(58) Field of Search ................. 438/257–267, 438/706, 713, 719, 723; 257/314–316, 326

(56) References Cited

U.S. PATENT DOCUMENTS

| 5,482,884 A | * | 1/1996 | McCollum et al. | ........... 437/60 |
|---|---|---|---|---|
| 5,831,325 A | * | 11/1998 | Zhang | ........................ 257/530 |
| 5,937,281 A | * | 8/1999 | Wu | .............................. 438/131 |
| 5,959,888 A | * | 9/1999 | Araki et al. | ................. 257/316 |
| 6,034,394 A | * | 3/2000 | Ramshey et al. | ........... 257/316 |
| 6,133,602 A | * | 10/2000 | Shrivastava et al. | ........ 257/314 |
| 6,387,756 B1 | * | 5/2002 | Muramatsu | ................. 438/266 |

\* cited by examiner

*Primary Examiner*—Benjamin L. Utech
*Assistant Examiner*—Duy-Vu Deo
(74) *Attorney, Agent, or Firm*—Powell Goldstein Frazer & Murphy LLP

(57) ABSTRACT

A process for planarization of a flash memory cell is described. A first polysilicon pattern having a top is formed over a substrate. A high-density plasma (HDP) oxide layer is deposited on the first polysilicon pattern, wherein the HDP oxide layer has a protuberance over the first polysilicon pattern. The HDP oxide layer and the first polysilicon pattern are partially etched by a sputtering etch technology. In this etching step, the protuberance is removed, the first polysilicon pattern is lowered, and the top of the first polysilicon pattern is rounded. A second polysilicon pattern covering the first polysilicon pattern is formed, wherein the second polysilicon pattern is wider than the first polysilicon pattern.

11 Claims, 5 Drawing Sheets

PROCESS FOR PLANARIZATION OF FLASH MEMORY CELL

FIELD OF THE INVENTION

This invention relates to semiconductors, and is more specifically related to a process for planarization of a flash memory cell.

BACKGROUND OF THE INVENTION

FIG. 1A and FIG. 1B are schematic, cross-sectional views of a conventional process for forming a floating gate. Referring to FIG. 1A, a polysilicon gate 112 is formed. Following to the formation, a silicon nitride layer 110 is deposited on the polysilicon gate 112. The silicon nitride layer 110 serves as a hard mask for the planarization of flash memory cells. However, the silicon nitride layer 110 has some drawbacks. First, the silicon nitride layer 110 needs to be removed with hot phosphorus acid in the following steps. The removal of the silicon nitride layer 110 is an additional step. Second, the silicon nitride layer 110 induces some defect issue and easily attracts mobile ions.

Still referring to FIG. 1A, a way to achieve planarization is to first deposit a high-density plasma oxide layer 104 over a substrate 100, wherein the silicon nitride layer 110 has the smallest thickness 120 of about 500 angstroms over the polysilicon gate 112. The HDP oxide layer 104 has the characteristic of having a sharp-pointed protuberance 108 on the silicon nitride layer 110 in a cross-sectional view. The sharp-pointed protuberance 108 is disadvantageous for the planarization and therefore needs to be removed.

Referring to FIG. 1B, to remove the silicon nitride layer 110 under the high-density plasma oxide layer 104 (FIG. 1A), a dipping process is performed to expose the silicon nitride layer 110. After the dipping process is performed, hot phosphorus acid is used to remove the silicon nitride layer 110. The nitride removal step takes a long time, about two hours. After that, several cleaning steps are necessary to ensure that no phosphorus acid remains on the substrate 100. Those cleaning steps also take time.

Taking a long time to remove the silicon nitride layer 110 means that the nitride layer 110 does have a great thickness. The thickness, for example, is about 1900 angstroms. Under the silicon nitride layer 110, the polysilicon pattern 112 (polysilicon gate) has a thickness of only about 1000 angstroms. In other words, the thickness of the silicon nitride layer 110 is almost double that of the polysilicon pattern 112. This thickness is a reason that a stress issue exists. In the subsequent thermal annealing step, the stress of the silicon nitride layer 110 is easily enhanced. The enhanced stress applies on the channel region 122 (in the surface of the substrate 100) under polysilicon pattern 112. With a transmission electronic microscope (TEM), some laceration traces due to the application are found in the channel region 122.

To sum up, the conventional process has the following drawbacks:

1. The dipping step, for partially removing the high-density plasma oxide layer, and the etching step for removing the silicon nitride layer, easily create defect issues.

2. Silicon nitride has an inherent stress problem, and increase the fabrication cost.

SUMMARY OF THE INVENTION

A purpose of the present invention is to provide a process in which planarization of a flash memory cell can be achieved. In this process, a first polysilicon pattern having a top is formed over a substrate. A high-density plasma (HDP) oxide layer is deposited on the first polysilicon pattern, wherein the HDP oxide layer has a protuberance over the first polysilicon pattern. The HDP oxide layer and the first polysilicon pattern are partially etched by a sputtering etch technology. In the etching step, the protuberance is removed, the first polysilicon pattern is lowered, and the top of the first polysilicon pattern is rounded. A second polysilicon pattern covering the first polysilicon pattern is formed, wherein the second polysilicon pattern is wider than the first polysilicon pattern.

According to a preferred embodiment of the present invention, the deposition and the etching of the high-density plasma oxide layer can be performed in the same chamber.

In another aspect, the present invention provides a process for forming a floating gate without formation of silicon nitride. The first polysilicon pattern having a top is formed over a substrate. A high-density plasma oxide layer covering the first polysilicon pattern is deposited in a first chamber. The high-density plasma oxide layer and the first polysilicon pattern are dry etched to partially remove the high-density plasma oxide layer and the first polysilicon pattern in a second chamber, the top of the first polysilicon pattern is therefore rounded. A second polysilicon pattern is formed over the substrate, wherein the second polysilicon pattern is wider than the first polysilicon pattern, and wherein the first and the second polysilicon patterns collectively serve as a floating gate.

The implementation of the present invention is a solution for a silicon nitride induced defect, and makes the formation of a floating gate more stable and controllable. Moreover, the process steps of the present invention are less than those of a conventional process.

On the other hand, according to the preferred embodiment of the present invention, a three dimensional floating gate having two polysilicon patterns is formed. This way of formation increases the gate coupling ratio (GCR) of the later-completed flash memory cell. Without the formation of a silicon nitride layer, there is no stress issue stemming from the silicon nitride layer. Moreover, hot phosphorus for removing silicon nitride is not necessary, thereby reducing the fabrication cost. Furthermore, without the step for removing silicon nitride, the process steps are simplified, and the fabrication cost is reduced. In the simplified process steps, no wet etching step is performed for removal of the high-density plasma oxide layer and the silicon nitride layer. This omission prevents the process from suffering defects and reliability issues.

BRIEF DESCRIPTION OF THE DRAWINGS

Referring to FIG. 2A, in this invention, no silicon nitride layer is formed. More specifically, a first polysilicon pattern 202, having a thickness greater than that of a conventional polysilicon pattern, is formed on a substrate 200, but no silicon nitride layer is subsequently formed thereon. Without the formation of the silicon nitride layer, a wet etching step using hot phosphorus to remove the silicon nitride layer is no longer necessary. Moreover, the stress issue stemming form a silicon nitride layer no longer exists.

DETAILED DESCRIPTION OF THE PREFERRED EMBODIMENT

Figure 1A:
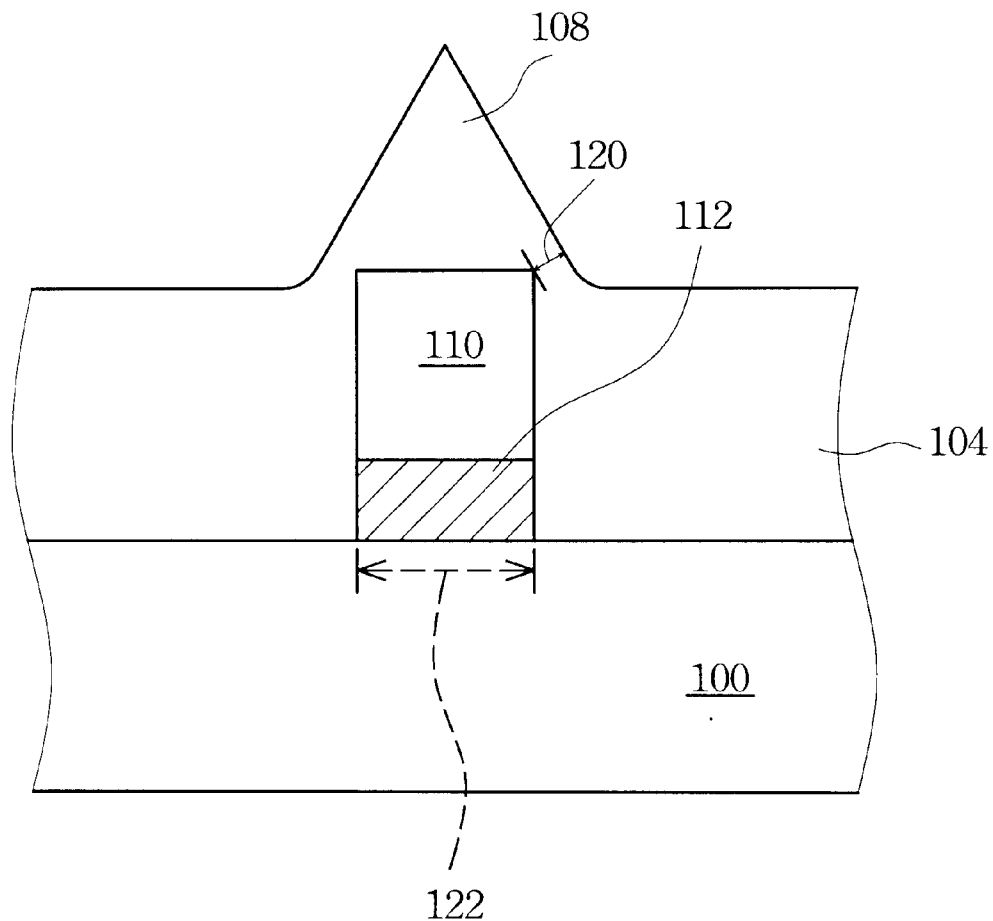
Referring to FIG. 1A and FIG. 1B, they are schematic, cross-sectional views of a conventional process for forming a floating gate.
Figure 1:
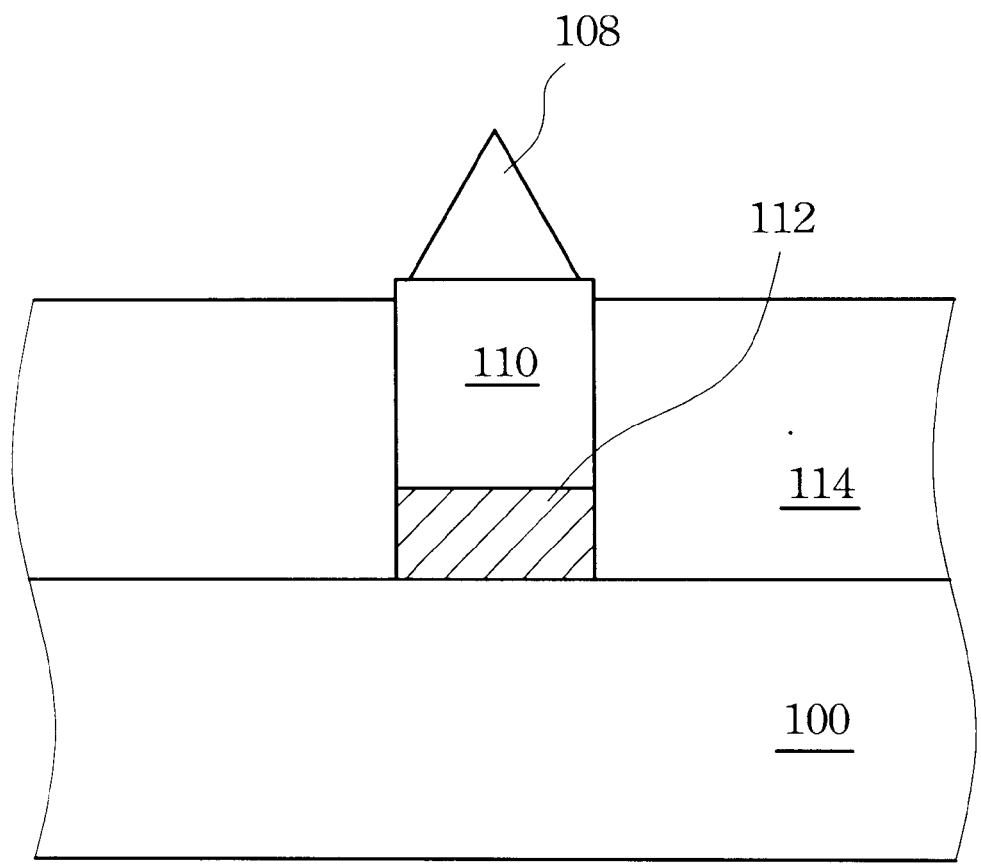
Figure 2A:
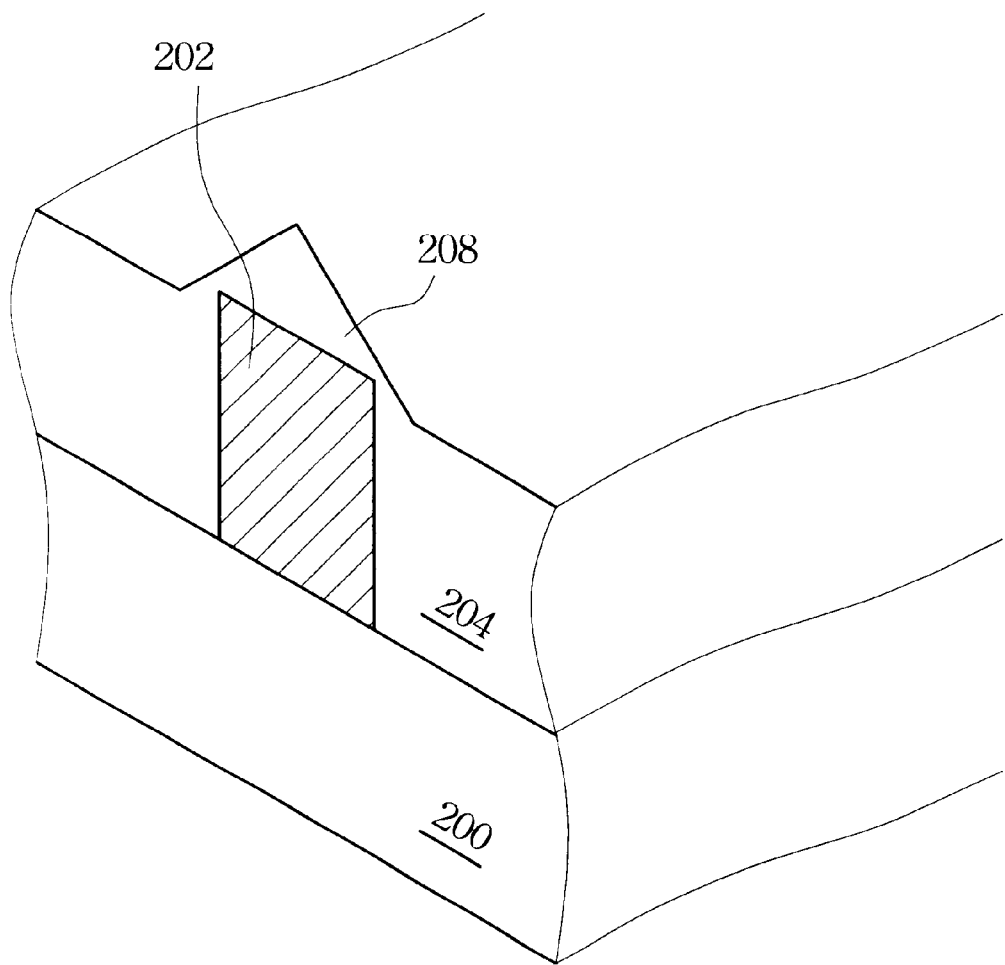
FIG. 2A to FIG. 2C are cross-sectional views schematically showing a process for forming a floating gate according to a preferred embodiment of the present invention.
Figure 2B:
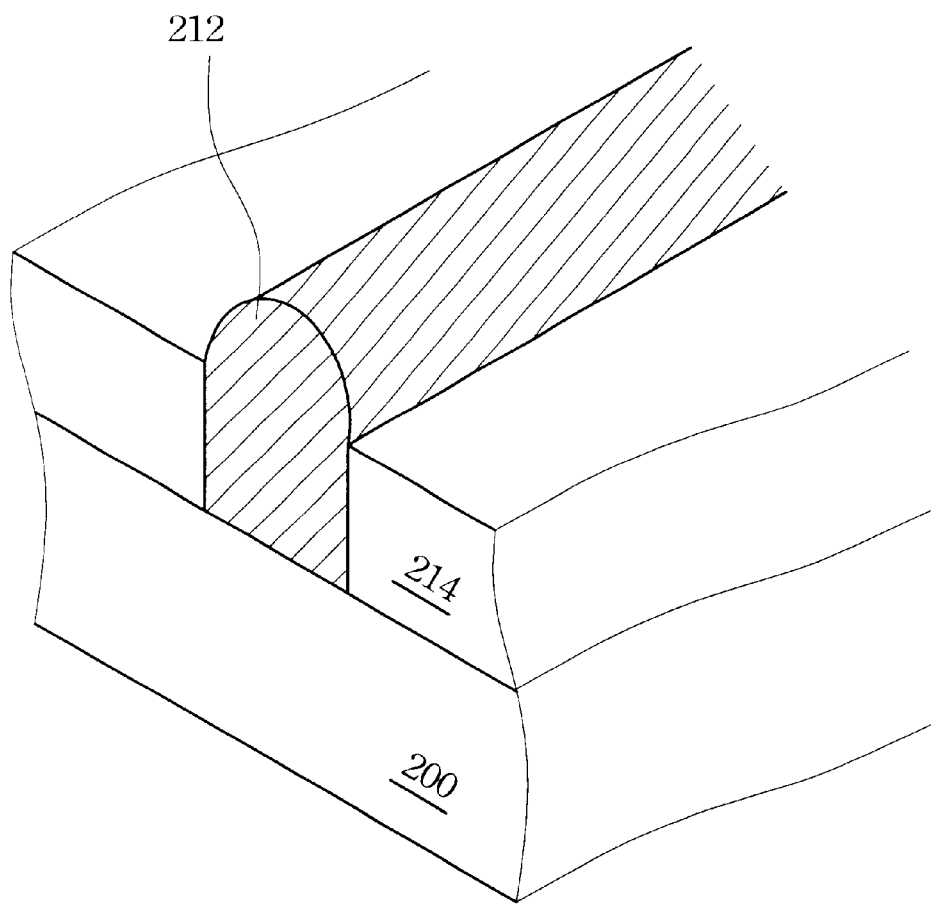
Figure 2C:
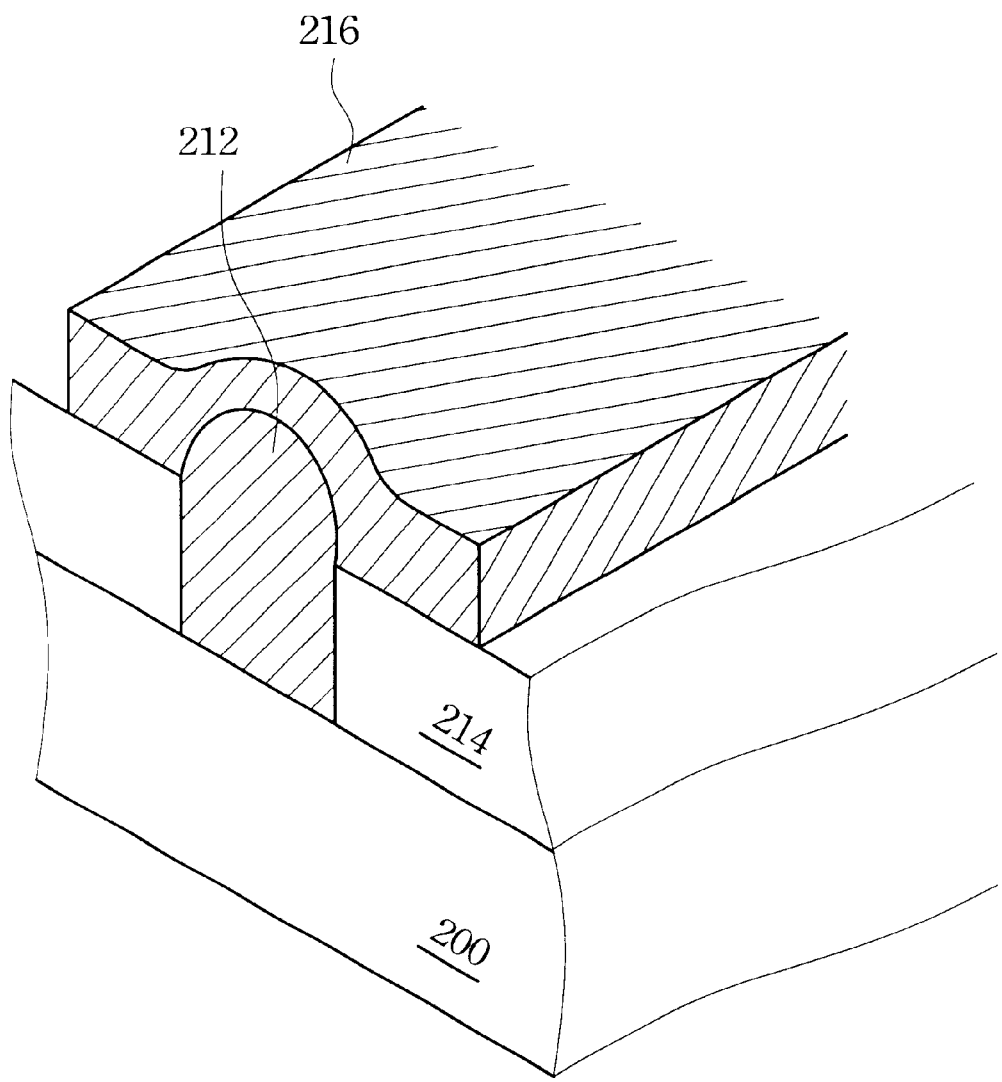

FIG. 2A to FIG. 2C are cross-sectional views schematically showing a process for forming a floating gate according to a preferred embodiment of the present invention. Referring to FIG. 2A, in this invention, no silicon nitride layer is formed. More specifically, a first polysilicon pattern 202, having a thickness greater than that of a conventional polysilicon pattern, is formed on a substrate 200, but no silicon nitride layer is subsequently formed thereon. Without the formation of the silicon nitride layer, a wet etching step using hot phosphorus to remove the silicon nitride layer is not necessary anymore. Moreover, the stress issue stemmed from a silicon nitride layer no longer exists.

After the formation of the first polysilicon patterns 202, a high-density plasma technology is applied to deposit a high-density plasma (HDP) oxide layer 204 covering the first polysilicon pattern 202 over the substrate 200. In a cross-sectional view, the HDP oxide layer 204 features that it has a sharp protuberance 208 on the first polysilicon pattern 202. The sharp protuberance 208 is disadvantageous for the planarization.

For planarization, the top of the first polysilicon pattern 212 (FIG. 2B) is rounded, and the HDP oxide layer 214 (FIG. 2B) is lowered until it is slightly lower than the first polysilicon pattern 212, by performing an etching step using a sputtering etch technology. Note that a sputtering etch technology usually uses argon gas plasma, which gas plasma is not sensitive to different materials. Because of the non-sensitivity, the HDP oxide layer 204 (FIG. 2A) and polysilicon 202 (FIG. 2A) are both partially etched. Although the rounded first polysilicon pattern 212 is somewhat thinner than the original polysilicon pattern 202, the etching step removes the unfavorable protuberance 208 (FIG. 2A).

The etching step and the deposition of the HDP oxide layer are performed in the same chamber. This manner, also so-called the in-situ process, is achieved since the chamber for the deposition of HDP oxide layer is also available for an etching step. Alternatively, an ex-situ process is performed, that is, after the HDP oxide layer is formed, the substrate is transferred to another chamber for being dry etched.

It should be noted that an etching step by a sputtering etch technology takes merely about ten to twenty minutes. Moreover, in an etching apparatus, more than one chamber could be simultaneously used for the etching step. Accordingly, being compared to the conventional dipping process using hot phosphorus acid, the etching step by a sputtering etch technology is more rapid.

Subsequently, a polysilicon layer is deposited and is then patterned over the first polysilicon pattern 212. The formed second polysilicon pattern 216 and the first polysilicon pattern 212 collectively serve as a floating gate. Because this second polysilicon pattern 216 is wider than the first polysilicon pattern 212, only the second polysilicon pattern 216 can be seen in a top view. The composite and three dimensional (3-D) floating gate has a large surface area, thereby increasing the gate coupling ratio of a later-completed flash memory cell. Other process steps for completing the formation of the flash memory cell, such as ONO deposition and controlling gate formation, are omitted since they can be easily achieved by one of ordinary skill.

Being compared to the conventional process, the present invention comprises the following advantages:

1. The process of the present invention is more stable and controllable.

2. The process steps are less than those of a conventional process.

3. The present invention provides a solution for a random defect issue.

Although the invention has been described in detail herein with reference to its preferred embodiment, it is to be understood that this description is by way of example only, and is not to be interpreted in a limiting sense. It is to be further understood that numerous changes in the details of the embodiments of the invention, and additional embodiments of the invention, will be apparent, and may be made by persons of ordinary skill in the art having reference to this description. It is contemplated that such changes and additional embodiments are within the spirit and true scope of the invention as claimed below.

What is claimed is:

1. A process for planarization of a flash memory cell, the process comprising:

forming a first polysilicon pattern having a top over a substrate;

depositing a high-density plasma (HDP) oxide layer on the first polysilicon pattern, wherein the HDP oxide layer has a protuberance over the first polysilicon pattern;

partially etching the HDP oxide layer and the first polysilicon pattern by a sputtering etch technology, thereby removing the protuberance, lowering the first polysilicon pattern and rounding the top of the first polysilicon pattern; and forming a second polysilicon pattern covering the first polysilicon pattern, wherein the second polysilicon pattern is wider than the first polysilicon pattern.

2. The process of claim 1, wherein the high-density plasma oxide layer is deposited in a chamber.

3. The process of claim 2, wherein the etching step is performed in the chamber.

4. The process of claim 1, wherein the second polysilicon pattern is formed by the following steps:

forming a polysilicon layer covering the first polysilicon pattern; and patterning the polysilicon layer.

5. A semiconductor process, comprising:

forming a first polysilicon pattern having a top over a substrate;

depositing a high-density plasma oxide layer on the first polysilicon pattern over the substrate in a first chamber, wherein the high-density plasma oxide layer has a protuberance on the first polysilicon pattern;

performing a dry etching step in a second chamber, thereby removing the protuberance, lowering the first polysilicon pattern, and rounding the top of the first polysilicon pattern; and forming a second polysilicon pattern covering the first polysilicon pattern over the substrate, wherein the second polysilicon pattern is wider than the first polysilicon pattern, and wherein the first and the second polysilicon patterns collectively serve as a floating gate.

6. The semiconductor process of claim 5, wherein the second polysilicon pattern is formed by the following steps:

forming a polysilicon layer on the first polysilicon pattern over the substrate; and patterning the polysilicon layer.

7. A process for forming floating gate without formation of silicon nitride, comprising:

forming a first polysilicon pattern having a top over a substrate;

depositing a high-density plasma oxide layer on the first polysilicon pattern over the substrate;

partially etching the high-density plasma oxide layer and the first polysilicon pattern by a sputtering etch technology, thereby rounding the top of the first polysilicon pattern;

forming a polysilicon layer covering the first polysilicon pattern over the substrate; and patterning the polysilicon layer to form a second polysilicon pattern, wherein the second polysilicon pattern is wider than the first polysilicon pattern, and wherein the first and the second polysilicon pattern collectively serve as a floating gate.

8. The process of claim 7, wherein the high-density plasma oxide layer is deposited in a chamber.

9. The process of claim 8, wherein the partially etching step is performed in the chamber.

10. A process for forming a floating gate without formation of silicon nitride, comprising:

forming a first polysilicon pattern having a top over a substrate;

depositing a high-density plasma oxide layer covering the first polysilicon pattern in a first chamber;

dry etching the high-density plasma oxide layer and the first polysilicon pattern to partially remove the high-density plasma oxide layer and the first polysilicon pattern in a second chamber, thereby rounding the top of the first polysilicon pattern; and forming a second polysilicon pattern over the substrate, wherein the second polysilicon pattern is wider than the first polysilicon pattern, and wherein the first and the second polysilicon patterns collectively serve as a floating gate.

11. The process of claim 10, wherein the second polysilicon pattern is formed by the following steps:

forming a polysilicon layer over the substrate; and patterning the polysilicon layer.

* * * * *